| (12) | United States Patent | (10) Patent No.: | US 7,648,860 B2 |
|---|---|---|---|
| | Lujan et al. | (45) Date of Patent: | Jan. 19, 2010 |

(54) SELF-ALIGNED THIN-FILM TRANSISTOR AND METHOD OF FORMING SAME

(75) Inventors: Rene Lujan, Sunnyvale, CA (US); William S. Wong, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/403,309

(22) Filed: Mar. 12, 2009

(65) Prior Publication Data

US 2009/0298240 A1    Dec. 3, 2009

Related U.S. Application Data

(62) Division of application No. 12/130,347, filed on May 30, 2008, which is a division of application No. 12/130,261, filed on May 30, 2008.

(51) Int. Cl.
*H01L 21/335* (2006.01)
*H01L 21/336* (2006.01)

(52) U.S. Cl. ............................. 438/142; 257/E21.412

(58) Field of Classification Search .................. 257/49, 257/52, 57, 60, E21.412; 438/142, 287, 299
See application file for complete search history.

(56) References Cited

U.S. PATENT DOCUMENTS

| 5,619,033 | A | 4/1997 | Weisfield |
|---|---|---|---|
| 5,648,674 | A | 7/1997 | Weisfield et al. |
| 6,348,693 | B1 | 2/2002 | Weisfield et al. |
| 6,717,152 | B2 | 4/2004 | Izumi |
| 6,856,670 | B2 | 2/2005 | Hoheisel |
| 7,078,702 | B2 | 7/2006 | Ringermacher et al. |
| 7,265,327 | B1 | 9/2007 | Park et al. |
| 2002/0163039 | A1* | 11/2002 | Clevenger et al. ........... 257/340 |
| 2008/0128752 | A1* | 6/2008 | Wu .............................. 257/194 |

\* cited by examiner

*Primary Examiner*—Thomas L Dickey
*Assistant Examiner*—Nikolay Yushin
(74) *Attorney, Agent, or Firm*—Jonathan A. Small

(57) ABSTRACT

A method of manufacturing a thin-film transistor or like structure provides conductive "tails" below an overhang region formed by a top gate structure. The tails increase in thickness as they extend outward from a point under the overhang to the source and drain contacts. The tails provide a low resistance conduction path between the source and drain regions and the channel, with low parasitic capacitance. The thickness profile of the tails is controlled by the deposition of material over and on the lateral side surfaces of the gate structure.

10 Claims, 7 Drawing Sheets

SELF-ALIGNED THIN-FILM TRANSISTOR AND METHOD OF FORMING SAME

CROSS REFERENCE TO RELATED CASES

The present disclosure is a divisional application based on U.S. patent application Ser. No. 12/130,347, titled "Self-Aligned Thin-Film Transistor and Method of Forming Same", filed May 30, 2008, which is incorporated by reference herein and to which priority is hereby claimed. The present disclosure also relates to U.S. patent application Ser. No. 12/130,261, titled "Isolated Sensor Structures Such As For Flexible Substrates", filed May 30, 2008, which is also incorporated by reference herein and to which priority is also hereby claimed.

STATEMENT REGARDING FEDERALLY SPONSORED RESEARCH AND DEVELOPMENT

Work related to this disclosure was performed with the support of U.S. Government under contract number 70NANB3H3029 awarded by the United States Department of Commerce, National Institute of Standards and Technology (NIST). Therefore, the U.S. Government has certain rights herein.

BACKGROUND

The present disclosure is related to solid-state devices such as thin-film transistors, and more specifically to methods of forming such devices utilizing a self-aligning technique.

Current methods for manufacturing arrays of amorphous silicon thin film transistors (a-Si:H TFTs) typically begin with the deposition of a metal on the substrate on which a layer of a-Si:H is deposited. Additional layers of conducting and insulating materials are formed and patterned by photolithographic processes to create source, gate and drain regions for each TFT. These photolithographic processes typically involve the deposition of layers of photosensitive or photoresistive materials. The photoresistive materials are exposed through a mask, developed to remove portions of the materials, then the structure is etched to remove portions of the conducting and/or insulating layers not protected by the remaining photoresistive materials, to thereby form electrically connected and isolated or semi-isolated regions. Through multiple photolithographic and deposition steps, an array of layered semiconductor devices and interconnections may be formed on the transmissive substrate.

More specifically, a typical TFT 10, for example of the type shown in FIG. 10, comprises a source region 12 and drain region 14 formed over a dielectric layer 16, a semiconductive layer 18, and a gate region 20, all formed over a substrate 22. In order for current to flow in a channel in layer 18, there must be an amount of overlap, $x_1$, $x_2$, between the lateral edges of source region 12 and drain region 14 on the one hand, and gate region 20 on the other hand. A certain amount of such an overlap is required in order to provide conductivity between the source/drain and channel (for the injection of carriers). However, too much overlap results in parasitic capacitance between the gate region and the source/drain regions, resulting is device switching speed degradation and latency.

A number of techniques have been developed for creating self-aligned structures, for example using the gate region 20 as a mask when exposing photocurable etch resist, doing laser recrystallization, etc. However, it has heretofore been difficult to form the desired overlap $x_1$, $x_2$ using such techniques.

SUMMARY

Accordingly, the present disclosure is directed to a TFT structure and method for providing that structure which may be produced using a form of a self-aligning, self-patterning process in which a desirable amount of overlap is formed between source/drain and gate regions. Specifically, the present disclosure provides the advantage of being able to pattern an overlying layer without special added processing steps. Isolated island structures are produced which serve to form overhang regions. The overhang regions partially mask regions therebelow, such that material may be deposited on top of the island structures and partly in gaps between the island structures. The material partly deposited in the gaps form a conduction path for carriers during operation of the TFT. The gaps formed between the discontinuous island structures also electrically isolate the island structures, and act as strain relief regions to accommodate stresses formed during manufacture.

According to one embodiment disclosed herein a structure is provided which comprises a substrate onto which is formed a gate, conductive channel, dielectric region, and a patterned gate metal. Selective etching of the dielectric/gate metal stack results in an over-etching of the dielectric and an undercutting of the gate metal, forming overhang regions. A subsequently deposited doped conductive layer forms source and drain regions, with "tails" which extend into the overhang regions. Patterned contact metal for source and drain contacts completes the structure.

According to another embodiment disclosed herein, a method is provided according to which a gate metal structure is patterned over a dielectric layer. The structure is selectively etched such that at least one lateral edge of the gate metal extends beyond the corresponding lateral edge(s) of an underlying dielectric layer to define an overhang region. The overhang region may, for example, be defined by the difference in etching rates between the gate metal and the dielectric layer.

A conductive layer such as doped silicon is then deposited over the gate metal such that it covers the top surface and at least a portion of a lateral edge(s) of the first doped sensor layer. For each TFT in an array of such devices, this structure is, as deposited, physically discrete from adjacent TFT structures, separated by gaps, discussed further below. In the process of depositing the conductive layer over the gate metal, material is also deposited in regions laterally adjacent the dielectric/gate metal stack. These regions form the source and drain of the TFT. Due to the partial masking of the overhang region, tails of the conductive layer extend into the overhang region. These tails provide a conduction path for operation of the TFT.

The deposition processes are performed at a relatively high temperature, causing expansion of the materials, including the substrate. The aforementioned gaps may therefore provide a strain relief region to accommodate thermally-induced expansion and contraction and provide a free surface at which crack propagation may terminate.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

FIGS. 1-5 illustrate various stages in the production of a thin film transistor (TFT) 30 according to the present disclosure. While each of FIGS. 1-5 illustrate the structure during stages of its manufacture, its manufacture follows a process such as that illustrated in FIG. 6, although the individual steps of such a process are not expressly further discussed in detail herein.

Figure 1:
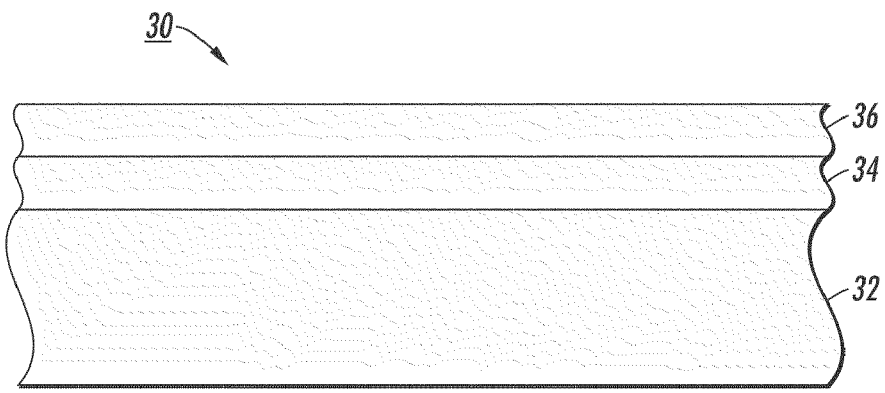
FIG. 1 is a cross-sectional view of an initial stage in the manufacture of a thin-film transistor or the like according to one embodiment disclosed herein.

While the actual composition and arrangement of TFT 30 may vary without departing from fundamental concepts of the present disclosure, in one example TFT 30 comprises a top gate TFT. With reference to FIG. 1, a conductive layer 34, such as hydrogenated amorphous silicon (a-Si:H) which is about 500 Å to about 700 Å thick, is formed over a substrate 32. Substrate may be any of a variety of materials such as a rigid glass substrate, a flexible plastic substrate, etc. A dielectric layer 36 is thereafter formed over conductive layer 34. Dielectric layer 36 may be, for example, silicon nitride (SiNx) about 2000-3000 Å thick.

Figure 2:
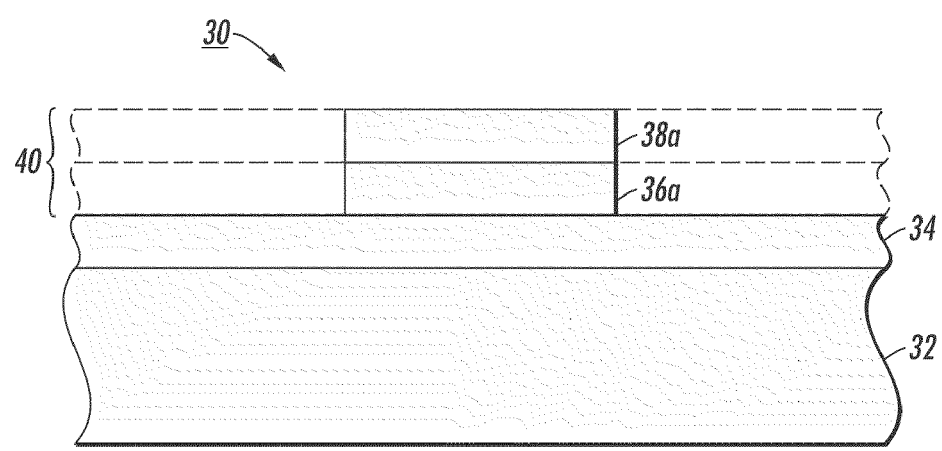
FIG. 2 is a cross-sectional view of an intermediate stage in the manufacture of a thin-film transistor or the like according to one embodiment disclosed herein.

With reference next to FIG. 2, a gate metal layer 38 is thereafter deposited over the structure and patterned such to produce a gate metal structure 38a. The gate metal comprises refractory metals, such as aluminum-chrome (AlCr), titanium-tungsten (TiW), etc., about 2000 Å (angstroms) thick.

A selective etch is next performed. In this embodiment, gate metal structure 38a has a higher resistance to certain etching than dielectric layer 36. Accordingly, when an appropriate etchant is presented to the surface of dielectric layer 36, it is etched at a different (typically much faster) rate that gate metal structure 38a, which may advantageously be employed as follows.

Figure 3A:
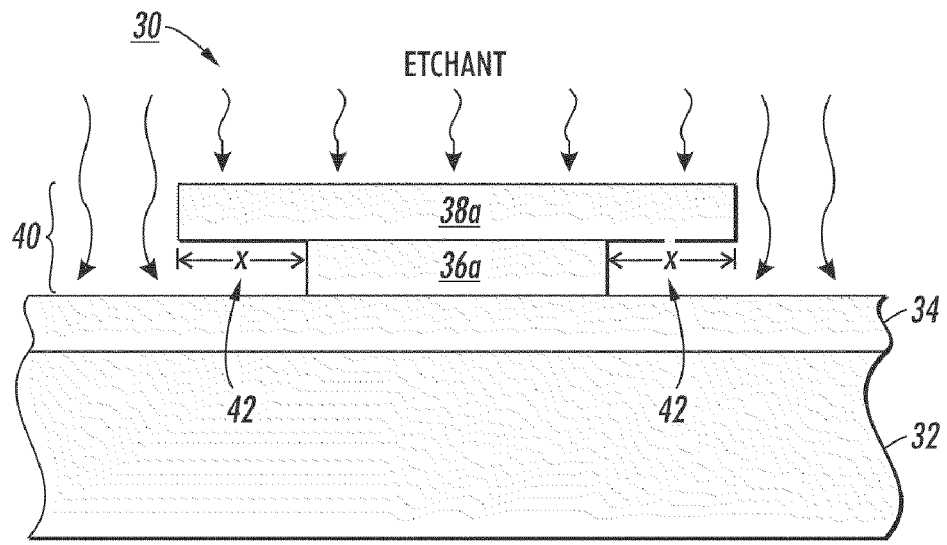
FIGS. 3A and 3B are a cross-sectional views of a further intermediate stage in the manufacture of a thin-film transistor or the like according to two embodiments, respectively, disclosed herein.
Figure 3B:
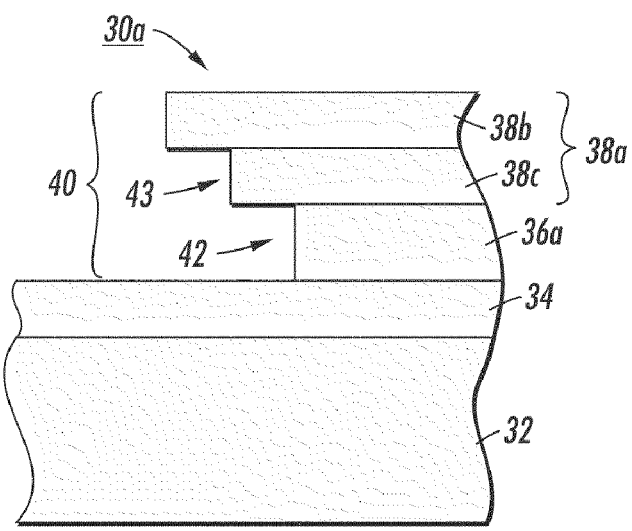

With reference to FIG. 3A a wet etch (or alternatively, a dry etch) is performed to remove portions of layers 36 and 38. Importantly, layer 36 is selected to have a relatively low selectivity to the etchant (it is relatively easily etched), and layer 38 is selected to have a relatively high selectivity to the etchant (resists etching). Accordingly, material forming layer 36 will be removed to a greater extent than the material forming layer 38. This creates structure 36a and an overhang region 42 on one or both lateral edges of the stack 40 of structures 36a and 38a. Optionally, structure 38a may be covered with a gate mask (not shown) prior to etching to enhance the formation of the overhang region(s) 42. This gate mask would remain during the etching process and can be removed after etch. The dielectric etch is selective so that it will not remove the mask, metal or Si layers. Alternatively, and with reference to FIG. 3B, the gate metal layer, 38, may be a bi-layer metal stack 38b/38c, composed for example of chromium (Cr) over aluminum (Al). The Cr layer may be undercut, for example, by over etching the Al layer thereunder. The dielectric can then be etched using the same mask, resulting in a second, staggered overhang 43.

While the precise lateral depth, x, of the overhang region is not critical, and is generally controlled by the etch parameters and material, as a general rule we have found it useful to form the overhang (or undercut) to have a depth approximately equal to the thickness of a conductive layer (44, shown in FIG. 4) formed over structure 38a. An exemplary depth x of overhang 42 would be 300 nm (approximately the same depth as the nitride thickness). Other methods of forming overhang 42 may also be employed without modification of the benefits of its presence in the ultimate structure. Accordingly, the bi-layer and etch process described form just one exemplary embodiment of an aspect of the present disclosure.

Figure 4:
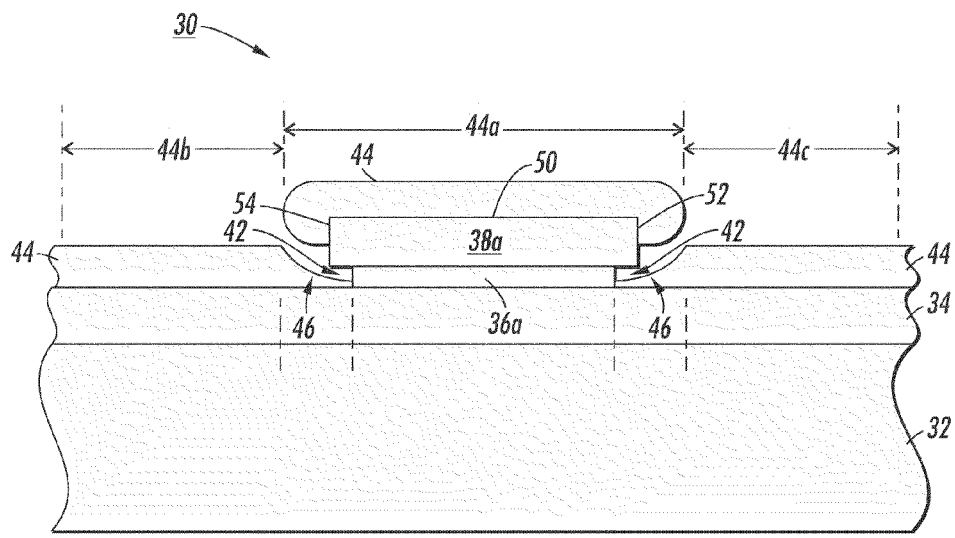
FIG. 4 is a cross-sectional view of a still further intermediate stage in the manufacture of a thin-film transistor or the like according to one embodiment disclosed herein.

As shown in FIG. 4, once structures 36a and 38a are deposited and patterned, and overhang 42 defined, a conductive layer 44 may next be formed over the structure. In one embodiment of the present disclosure, layer 44 is n+ phosphorous doped amorphous silicon deposited by Plasma-enhanced chemical vapor deposition (PECVD). The thickness of layer 44 is important as it controls the formation of structures referred to herein as "tails" 46, described further below. An exemplary thickness for layer 44 is on the order of 1000 Å.

We have discovered, that by providing a structure with overhangs 42, the deposition of layer 44 forms three distinct, simultaneously formed regions: region 44a over stack 40, and regions 44b and 44c to the sides of stack 40. The material comprising region 44a attaches not only to the upper surface 50 of structure 38a, but also to its lateral edges 52, 54 as well. As the region 44a is deposited, and accumulates on lateral edges 52, 54, the material so accumulating masks an area therebelow, beginning in the overhang regions 42, from further deposition. As the material forming region 44a on lateral edges 52, 54 grows larger, more area is masked. A portion of the material forming layer 44 in regions 44b and 44c, the tails, begins with an area in the overhang regions 42 and extend outwardly to a point at which there is no further masking. Importantly, it is the overhang regions 42 which facilitate the formation of the masking portions of region 44a on lateral edges 52, 54, which in turn produce tails 46. It will also now be appreciated that the thickness of layer 44 (as well as, in some embodiments, the rate of deposition) controls the width of region 44a and hence the amount of masking of regions thereunder.

Figure 5:
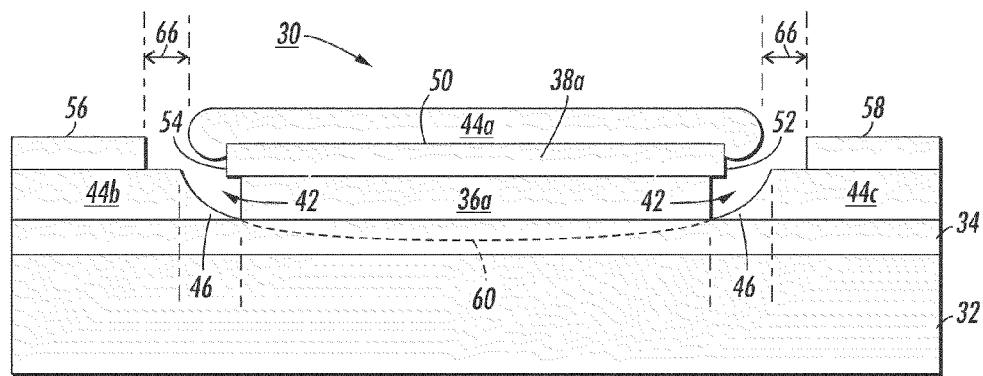
FIG. 5 is a cross-sectional view of a final stage in the manufacture of a thin-film transistor or the like according to one embodiment disclosed herein.
Figure 6:
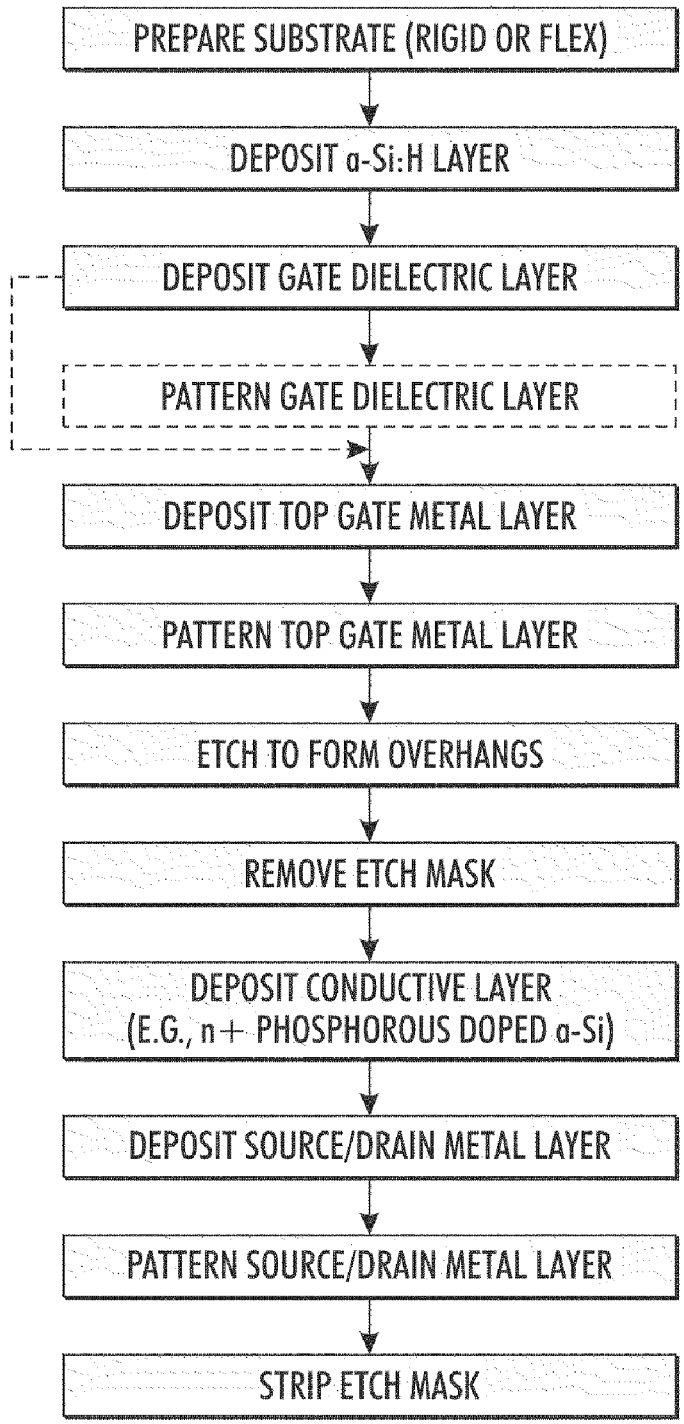
FIG. 6 is a flow chart showing the steps in the manufacture of a thin-film transistor or the like according to one embodiment disclosed herein.

Regions 44b and 44c of layer 44 which are not masked by region 44a form to the same thickness as region 44a above stack 40. A portion of region 44b can then serve as the source for TFT 30, and a portion of region 44c can serve as the drain for TFT 30. Structure 38a then serves as the gate for TFT 30, and region 36a serves as the gate dielectric isolating structure 38a from the channel which may form in the a-Si:H layer 34 therebelow. In order to facilitate electrical connection to the structure, source and drain metal regions 56, 58, for example Al (100 nm)/Cr(100 nm), are deposited and patterned. A cut-away view of a completed device is shown in FIG. 5.

In operation, tails 66 serve as conduction paths for current to enter channel 60 under control of gate formed by gate structure 38a. We have found that the shape and size of tails 46 can be controlled to achieve optimum current injection, while minimizing the parasitic capacitance usually associated with an overhanging source/drain. In one embodiment, tails 46 have a non-linear profile, resulting from the material accumulating at the lateral edges of region 44a.

Figure 7:
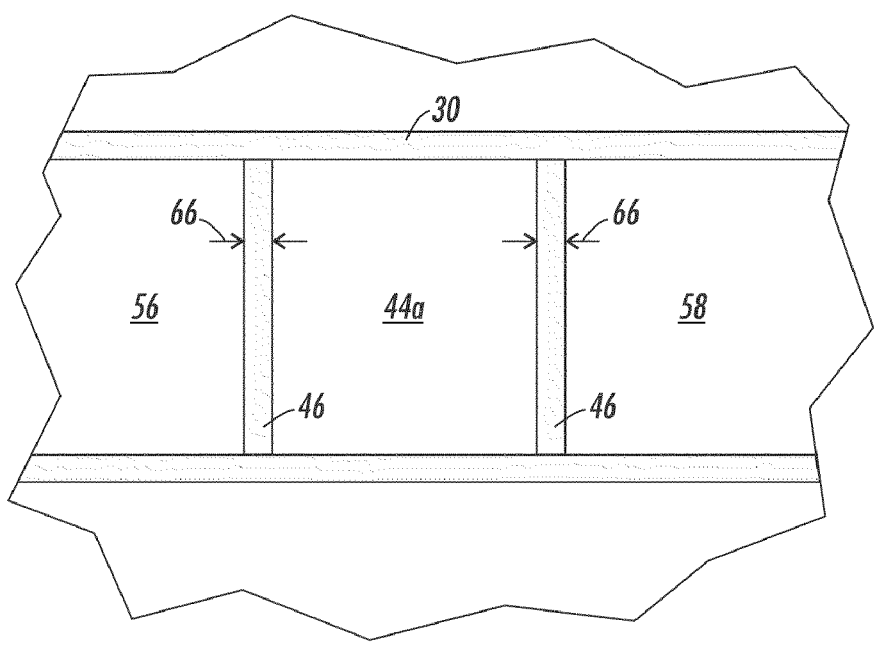
FIG. 7 is a plan view of a final stage in the manufacture of a thin-film transistor or the like according to one embodiment disclosed herein.

With reference next to FIG. 7, there is shown therein a plan view of TFT 30. It can be seen from FIG. 5 and FIG. 7 that region 44a is both mechanically and electrically isolated from adjacent structures by gaps 66. Gaps 66 help to accommodate stress that may accumulate in layer 40 when deposited. As a part of the deposition process for certain layers, the TFT structure is exposed to relatively large thermal cycling, resulting in expansion and contraction during manufacturing. This is especially true for devices formed on flexible substrates, sensor structures with relatively thick sensor layers overlying the TFT, etc. Gaps 66 allow for some movement of the various portions of the structure relative to one another without the cracking and failure. The width of gap 66 may vary, but in certain embodiments may be as large as the thickness of n+ Si layer 44, assuming the lateral deposition is the same as the vertical direction, for example between 20-100 nm.

Figure 8:
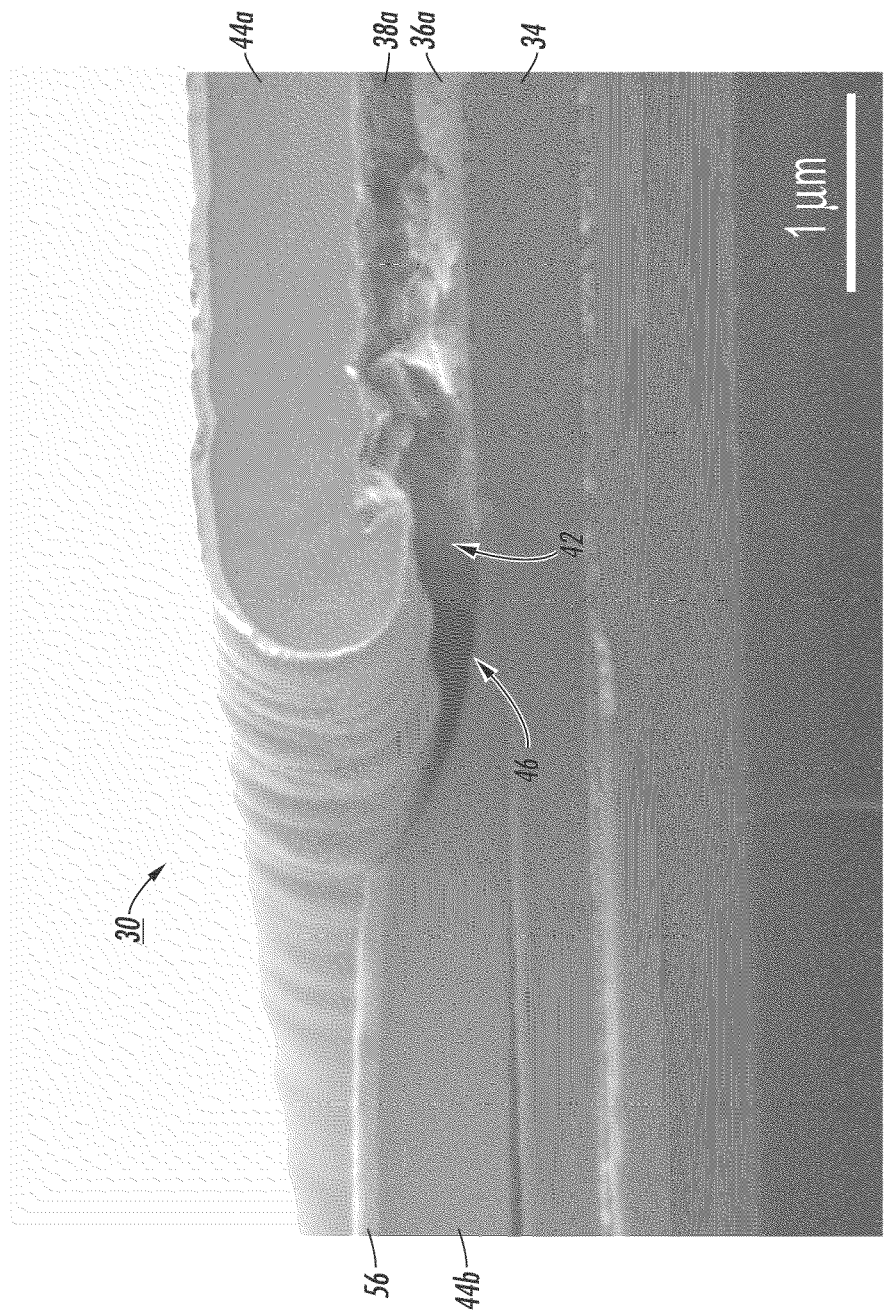
FIG. 8 is a micro-photograph of a cross-section of a partial thin-film transistor structure according an embodiment disclosed herein.

FIG. 8 is a micro-photograph of a cross-section of a partial structure according to the present disclosure. Overhang region 42 is formed adjacent stack 40. Structure 44a forms such that it creates tail 46. Based on this, a self-aligned TFT 30 can be produced with a improved carrier injection from source 44b and reduced parasitic capacitance.

Figure 9:
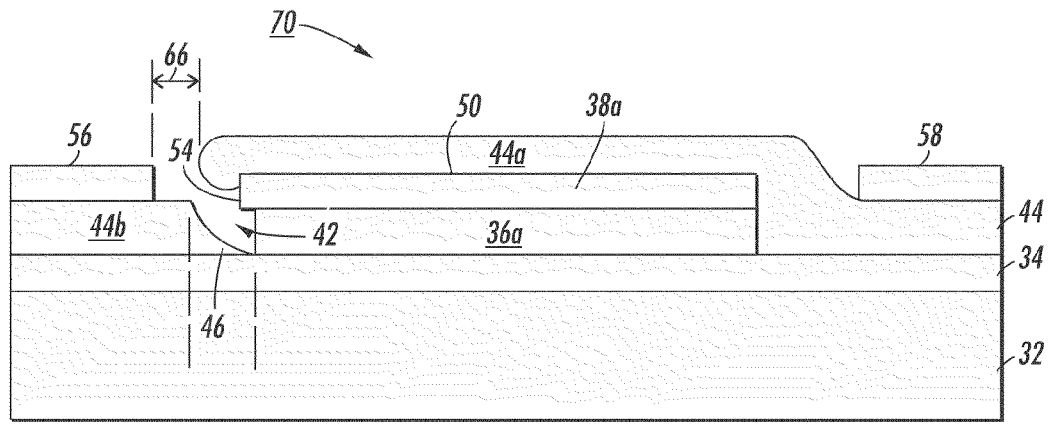
FIG. 9 is a cross-sectional view of a final stage in the manufacture of a thin-film transistor or the like according to another embodiment disclosed herein.
Figure 10:
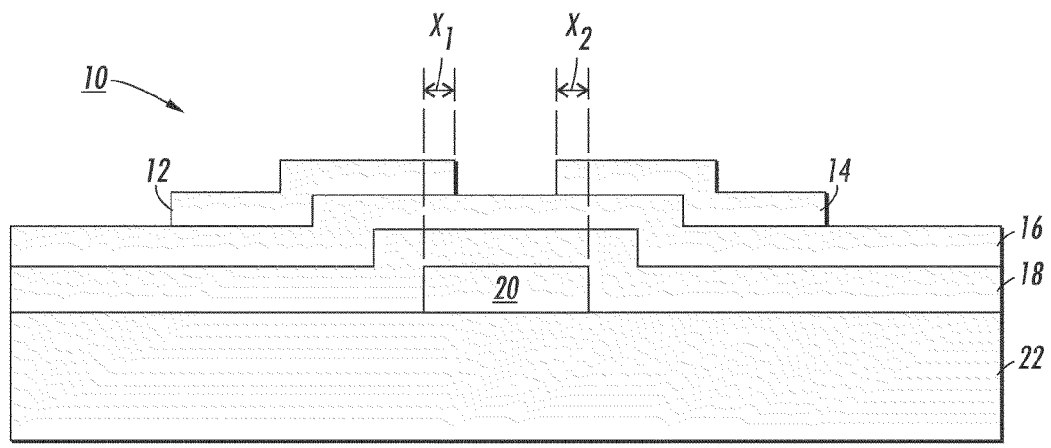
FIG. 10 is a cross-sectional view of a thin-film transistor according to the prior art.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. For example, FIG. 9 shows a structure 70 similar to that previously described, but for there being only a single overhang portion of region 44a, producing a single tail region 46 of region 44b. Thus, it will be appreciated that the overhang-tail arrangement of the present disclosure is useful for creating a variety of structures, and is not to be limited by the embodiments disclosed herein. Therefore, the foregoing detailed description provides those of ordinary skill in the art with a convenient guide for implementation of the disclosure, by way of examples, and contemplates that various changes in the functions and arrangements of the described embodiments may be made without departing from the spirit and scope of the disclosure defined by the claims thereto.

What is claimed is:

1. A method of manufacturing a device usable as a thin-film transistor, comprising:
    depositing a semiconducting layer over a substrate;
    depositing a dielectric layer over said semiconducting layer;
    depositing a gate metal layer over said dielectric layer;
    patterning said gate metal layer to form a gate metal structure, said gate metal structure having an upper surface and lateral surfaces;
    patterning said dielectric layer, using said gate metal structure as a mask, to form a dielectric structure, said dielectric structure having lateral surfaces;
    etching at least said lateral surfaces of said dielectric structure such that said lateral surfaces of said dielectric structure are etched to a greater extent than said lateral surfaces of said gate metal structure, to thereby form an overhang region below said gate metal structure and adjacent said lateral surfaces of said dielectric structure;
    depositing a conductive layer over said upper surface of said gate metal structure and said semiconducting layer, said conductive layer comprising:
        a first region, formed over said gate metal structure such that said first region extends beyond the lateral dimension of said gate metal structure and a portion thereof is in physical and electrical contact with said lateral surfaces of said gate metal structure, extending over said first overhang region;
        a second region, extending laterally from within said overhang region and increasing in thickness from a location proximate a lateral edge of said dielectric structure within said overhang region to a region outside of said overhang region and laterally adjacent said dielectric structure; and
        a third region extending laterally in a direction opposite to the lateral direction of said second region so as to be disposed laterally adjacent said dielectric structure and on a side opposite from said second region relative to said dielectric structure;
    whereby said gate metal structure may act as a gate controlling current flow in a channel defined therebelow in said semiconductive layer between said second region and said third region.

2. The method of claim 1, further comprising forming said third region to extend laterally from within an overhang region and increasing in thickness from a location proximate a lateral edge of said dielectric structure within said overhang region to a region outside of said overhang region and laterally adjacent said patterned dielectric structure.

3. The method of claim 1, wherein said portion of said second region formed below said first overhang region comprises a tail having a non-linear thickness profile.

4. The method of claim 3, wherein said thickness profile of said tail is formed by the increasing thickness of said first region on said lateral surface of said gate metal structure as said first region is deposited.

5. The method of claim 2, wherein said portion of said third region formed below said overhang region comprises a tail having a non-linear thickness profile.

6. The method of claim 5, wherein said thickness profile of said tail is formed by the increasing thickness of said first region on said lateral surface of said gate metal structure as said first region is deposited.

7. The method of claim 1, wherein said semiconductive layer is amorphous silicon (a-Si:H).

8. The method of claim 1, wherein said first and second conductive material structure are comprised of n+ doped silicon.

9. The method of claim 2, further comprising depositing source and drain contact structures over and in physical and electrical contact with said second and third regions, respectively.

10. The method of claim 1, wherein said first overhang region is formed to have a lateral dimension approximately equal to the thickness of said first conductive structure.

* * * * *